(12) United States Patent
Kinmont et al.

(10) Patent No.: US 11,384,422 B2
(45) Date of Patent: Jul. 12, 2022

(54) NANOPARTICLE COATING METHOD

(71) Applicant: MAGNETIC LAMINATES LTD, Stroud (GB)

(72) Inventors: Patrick William John Kinmont, Cirencester (GB); Robert Davidson Binns, Stroud (GB); Christopher Robin Binns, Stroud (GB)

(73) Assignee: Magnetic Laminates Ltd., London (GB)

( * ) Notice: Subject to any disclaimer, the term of this patent is extended or adjusted under 35 U.S.C. 154(b) by 124 days.

(21) Appl. No.: 16/465,143

(22) PCT Filed: Nov. 27, 2017

(86) PCT No.: PCT/GB2017/053550
§ 371 (c)(1),
(2) Date: May 29, 2019

(87) PCT Pub. No.: WO2018/100344
PCT Pub. Date: Jun. 7, 2018

(65) Prior Publication Data
US 2019/0330732 A1    Oct. 31, 2019

(30) Foreign Application Priority Data
Nov. 29, 2016 (GB) .................................... 1620196

(51) Int. Cl.
*C23C 14/16* (2006.01)
*H01F 1/00* (2006.01)
(Continued)

(52) U.S. Cl.
CPC ......... *C23C 14/165* (2013.01); *H01F 1/0018* (2013.01); *H01F 1/147* (2013.01);
(Continued)

(58) Field of Classification Search
None
See application file for complete search history.

(56) References Cited

U.S. PATENT DOCUMENTS 4,433,474 A    2/1984  Hemmat
2018/0037966 A1*  2/2018  Hayakawa .............. C22C 38/60

FOREIGN PATENT DOCUMENTS

EP    0076918 A1    4/1983
GB    2509888 A     7/2014
(Continued)

OTHER PUBLICATIONS

Machine translation of KR20130010224. (Year: 2013).*
(Continued)

*Primary Examiner* — Xiaowei Su
(74) *Attorney, Agent, or Firm* — Craig J. Lervick; Larkin Hoffman Daly & Lindgren, Ltd.

(57) ABSTRACT

The present invention provides a method for producing a magnetic nanoparticle-coated laminate material. The method comprises coating a pair of opposed surfaces of a plurality of steel or iron/cobalt (Fe/Co) alloy film portions with a magnetic nanoparticle-containing coating. Each magnetic nanoparticle comprises a core and a shell covering at least a portion of the core. The shell and core are made of different materials selected from one or more of: iron, cobalt, nickel; and/or alloys comprising two or more of: iron, cobalt and/or nickel; and/or magnetic rare earth metals; and/or diamagnetic transition metals. The method further comprises stacking the coated film portions on top of each other such that a or each coated surface of each film portion is located adjacent a further coated surface of an adjacent film portion; and compressing the stacked coated film portions together to form a nanoparticle-coated laminate material.

19 Claims, 2 Drawing Sheets

(51) Int. Cl.
*H01F 1/147* (2006.01)
*H02K 1/02* (2006.01)
*H01F 41/02* (2006.01)
*C23C 30/00* (2006.01)

(52) U.S. Cl.
CPC ..... *H01F 41/0213* (2013.01); *H01F 41/0233* (2013.01); *H01F 41/0246* (2013.01); *H02K 1/02* (2013.01); *C23C 30/00* (2013.01); *H01F 41/02* (2013.01)

(56) References Cited

FOREIGN PATENT DOCUMENTS

| JP | 2011259593 A | | 12/2011 |
|---|---|---|---|
| KR | 20130010224 A | * | 1/2013 |
| WO | 2004027104 A2 | | 4/2004 |

OTHER PUBLICATIONS

"GB Examination Report", Application No. GB1620196.4 from the United Kingdom Intellectual Property Office, dated Mar. 1, 2017, 2 pages.
"International Search Report", Application No. PCT/GB2017/053550 from the International Bureau, dated Mar. 21, 2018, 2 pages.
Lai, Jiun-Yu, "A Study of the Fabrication of Thin Lamination Stator Cores by the Uniform Droplet Spray Process", Thesis excerpt, Massachusetts Institute of Technology, Jun. 2017, 3 pages.

* cited by examiner

NANOPARTICLE COATING METHOD

The present invention relates to a method for producing a magnetic nanoparticle-coated laminate or coiled material. The present invention also relates to a method for producing components of electromagnetic apparatus, such as for example motors or generators, from magnetic nanoparticle-coated laminate or coiled material. The present invention also relates to an apparatus for producing a magnetic nanoparticle-coated laminate or coiled material. The present invention also relates to nanoparticle-coated laminate or coiled material for use in components of electromagnetic apparatus.

BACKGROUND TO THE INVENTION

Magnetic materials find widespread use in modern technology and are to be found in nearly all electro-mechanical apparatus. The most fundamental property, i.e. saturation magnetisation, of magnetic material determines the strength of the produced magnetic field. The most magnetic material for use in electro-mechanical apparatus, i.e., $Fe_{60}Co_{40}$ alloy, has been available since the 1920s and until recently there has been no material found with a higher magnetisation.

The most direct measure of saturation magnetisation is the magnetic moment per atom which is specified in Bohr magnetons ($\mu\beta$). The magnetic moment for pure Fe is $2.22\mu\beta$ per atom, whereas for $Fe_{60}Co_{40}$ alloy the magnetic moment is $2.45\mu\beta$ per atom. The latter value, i.e., $2.45\mu\beta$ per atom, is termed the Slater-Pauling limit and was believed to be the ultimate magnetisation available from transition metal alloys. Generally, the efficiency of electro-mechanical apparatus improves as the square of the magnetisation of the magnetic material. Even small increases in magnetisation are therefore valuable especially in green technologies such as electric vehicles and wind turbines.

Upon development in the early 1990s of gas-phase nanoparticle sources capable of depositing nanoparticles with diameters in the range of 1 to 5 nm it was discovered that the magnetic moments per atom of Fe, Co and Ni nanoparticles with diameters no more than about 5 nm are significantly higher than for bulk structures formed from the same material. In view of this, magnetic structures in which nanoparticles of one of Fe and Co are embedded in a matrix of the other of Fe and Co have been developed with such magnetic structures having a magnetisation which exceeds the magnetisation of $Fe_{60}Co_{40}$ alloy to thereby break the Slater-Pauling limit for the first time. Co-deposition of Fe nanoparticles and Co matrix material, produced as a metal vapour, for example, by a molecular beam epitaxy (MBE) or sputter source, results in a structure in which Fe nanoparticles are distributed through and embedded in the Co matrix. According to an alternative approach a magnetic structure in which Co nanoparticles are distributed through and embedded in an Fe matrix is formed by co-deposition of Co nanoparticles from the cluster source and of Fe matrix material from the MBE or sputter source.

It has been found that Co nanoparticles embedded in an Fe matrix yields values approaching $3\mu\beta$ per atom. At lower Fe volume fractions the magnetic moment per atom for Fe nanoparticles embedded in a Co matrix exceeds the corresponding value defined by the Slater-Pauling curve. The improvement is seen because the fundamental building blocks of the material already have an enhanced magnetisation and also because the matrix itself has a nanostructure which leads to enhanced moments. More specifically there is a higher proportion of atoms at a surface or interface in a nanostructure (approaching 50% in the presently described structure) with each such atom having enhanced spin and orbital moments. It has also been found that the magnetisation falls below the Slater-Pauling curve at Fe volume fractions of more than about 20% which is the percolation threshold. As described in UK Patent Application no. 1216538.7, the present inventors found high levels of aggregation of Fe nanoparticles at higher levels of Fe volume fractions which produced a phase separated mixture of macroscopic grains and the magnetisation falls as a consequence to a weighted average of the magnetic moments of Co ($1.7\mu\beta$ per atom) and Fe ($2.22\mu\beta$ per atom). This is the reason for the fall in the magnetisation to below the Slater-Pauling curve at higher Fe volume fractions. The above patent described a method to prevent phase separation by using core-shell nanoparticles allowing the highest possible magnetisations to be achieved. The remainder of the description here assumes this technology is available and "nanoparticle" refers either to simple elemental nanoparticles or complex core-shell nanoparticles.

Up to now the technology for producing high-moment nanoparticle films has only been able to produce thin films. It is an object for the present invention to provide a method for producing bulk components made out of nanoparticle-coated laminate or coiled materials with improved magnetism. It is a further object of the present invention to provide a method for producing nanoparticle-coated laminate or coiled materials with improved magnetism for use in electromagnetic apparatus, such as for example motors or generators. The dimensions and therefore the weight of a component produced from nanoparticle-coated laminate or coiled material for use in electromagnetic apparatus, such as for example a motor, generator or turbine, may be significantly reduced due to improved magnetism. It is a further object of the present invention to provide nanoparticle-coated components made from nanoparticle-coated laminate or coiled materials for electromagnetic apparatus with increased efficiency.

SUMMARY OF THE INVENTION

The present invention seeks address the problems of the prior art.

According to a first aspect of the present invention there is provided a method for producing a magnetic nanoparticle-coated laminate material comprising:

coating at least one surface of a pair of opposed surfaces of a plurality of steel or iron/cobalt (Fe/Co) alloy film portions with a magnetic nanoparticle-containing coating, in which each magnetic nanoparticle comprises one or more of:

iron, cobalt, nickel; and/or alloys comprising two or more of: iron, cobalt and/or nickel; and/or magnetic rare earth metals; and/or diamagnetic transition metals;

stacking the coated film portions on top of each other such that each at least one coated surface of each film portion is located between adjacent film portions; and compressing the stacked coated film portions together to form a nanoparticle-coated laminate material.

According to a second aspect of the present invention there is provided a method for producing a magnetic nanoparticle-coated coiled material comprising:

coating at least one surface of a pair of opposed surfaces of a plurality of steel or iron/cobalt (Fe/Co) alloy film portions with a magnetic nanoparticle-containing coating, in which each magnetic nanoparticle comprises one or more of:
iron, cobalt, nickel; and/or
alloys comprising two or more of: iron, cobalt and/or nickel; and/or
magnetic rare earth metals; and/or
diamagnetic transition metals;
coiling the coated film portions such that each at least one coated surface of each film portion is located between adjacent film portions; and
compressing the coiled coated film portions together to form a nanoparticle-coated coiled material.

The film portions and/or coating step for producing of the laminate or coiled material may be provided by in one embodiment 3D printing using a 3D printing apparatus. In one embodiment, the film portions are produced using 3D printing, and a coating of nanoparticles containing coating is applied to one or more surfaces of the film portions during and/or after production using 3D printing.

In one embodiment, one or more, preferably each magnetic nanoparticle comprises a core and a shell covering at least a portion of the core. Preferably, the shell and core are made of different materials selected from:
iron, cobalt, nickel; and/or
alloys comprising two or more of: iron, cobalt and/or nickel; and/or
magnetic rare earth metals; and/or
diamagnetic transition metals.

Preferably, each pair of opposed surfaces of the plurality of film portions are coated with a magnetic nanoparticle containing coating. By coating both of the opposed surfaces of the film portions, the coated laminate or coiled materials have increased magnetism as a result of the materials comprising an increased proportion of materials having higher magnetism.

According to one embodiment, the film portion is only coated on a pair of opposed surfaces. The remaining surfaces of the film portion remain coating-free.

The film portions may be provided as discrete film portions. Alternatively, the film portions may be provided as a continuous film. The method may further comprise cutting the coated continuous film into separate coated film portions of predetermined dimensions prior to stacking or coiling.

According to a further aspect of the present invention, there is provided a coated laminate material formed from a plurality of nanoparticle-coated steel or iron/cobalt (Fe/Co) alloy film portions, in which each nanoparticle is made of different materials selected from one or more of:
iron, cobalt, nickel; and/or
alloys comprising two or more of: iron, cobalt and/or nickel; and/or
magnetic rare earth metals; and/or
diamagnetic transition metals.

According to a further aspect of the present invention, there is provided a coated coiled material formed from a plurality of nanoparticle-coated steel or iron/cobalt (Fe/Co) alloy film portions, in which each nanoparticle is made of different materials selected from one or more of:
iron, cobalt, nickel; and/or
alloys comprising two or more of: iron, cobalt and/or nickel; and/or
magnetic rare earth metals; and/or
diamagnetic transition metals.

Preferably, the shell and core of each respective nanoparticle of the nanoparticle-coated steel or iron/cobalt alloy film portions are made of different materials selected from one or more of:
iron, cobalt, nickel; and/or
alloys comprising two or more of: iron, cobalt and/or nickel; and/or
magnetic rare earth metals; and/or
diamagnetic transition metals.

The coated laminate material or coated coiled material may be further machined to form a nanoparticle-containing coated component of an electromagnetic apparatus, such as for example a motor or generator component having a predetermined shape and dimensions. Alternatively, the coated laminate material or coated coiled material may not require further machining prior to use.

One or more of the stacking or coiling, and/or compressing and/or machining steps may be carried out at ambient temperature.

One or more of the stacking or coiling, and/or compressing and/or machining steps may be carried out under ultra-high vacuum According to one embodiment, the method for producing the magnetic nanoparticle-coated laminate or coiled material may further comprise a step of producing the magnetic nanoparticles of the magnetic nanoparticle coating under ultra-high vacuum. The subsequent step of coating the film portions may be carried out at any suitable pressure and/or temperature. For example, the step of coating may be carried out at atmospheric temperature. The velocity of the magnetic nanoparticles is preferably sufficient to impinge the film portions to provide the coating.

The compression stage is preferably carried out under ultra-high vacuum. In some embodiments, the compression stage is required to be carried out under ultra-high vacuum to minimise or reduce any oxidation of the coated surface(s).

Once compressed, any subsequent machining steps may be carried out under normal atmospheric pressure.

During production of a coated coiled material, compression can be applied at the same time as coating the surface(s) of the film. Furthermore, according to some embodiments compression may, in addition or in the alternative, be applied while the coated film portions are being coiled. Alternatively, during production of a coated coiled material, compression may be provided in a plurality of separate distinct stages during production, for example in a plurality of distinct stages during coating of the film portions and/or during coiling of the film portions. According to some embodiments, compression may be applied, in addition or in the alternative, after coating of the surface(s) of the film portions and/or after coiling of the film portions.

The film portions or continuous film used in the methods of the present invention as described herein may have a thickness of no more than 2 mm. Preferably, the film portions or continuous film have a thickness of no more than 1 mm, more preferably no more than 0.5 mm, for example about 0.2 mm.

The term "thickness" is used herein to refer to the dimension extending substantially perpendicular to the plane of the pair of opposed surfaces of the film portion.

The film portions or continuous film used in the methods of the present invention as described herein may have a thickness of at least 0.01 mm, preferably at least 0.05 mm, more preferably at least 0.1 mm, for example about 0.2 mm.

Preferably, the film portions or continuous film used in the methods of the present invention have a thickness of 0.2 mm.

The film portions or continuous film used in the methods of the present invention as described herein to form the coated laminate or coated coiled material are preferably of equal thickness along the entire length and/or width of the film portion or film. The term "length" is used herein to refer to the dimension extending within the plane of and substantially parallel to the longitudinal axis of the film portion or film. The term "width" is used herein to refer to the dimension extending within the plane of and substantially perpendicular to the longitudinal axis of the film portion or film.

The thickness of the film portions is preferably uniform, ie. having the same thickness as each of the other film portions, within the coated laminate material or coated coiled material. It is however to be understood that the thickness of the film portions within the coated laminate material or coated coiled material may vary depending on the particular requirements for the coated material.

Each magnetic nanoparticle may be of a diameter of no more than substantially 100 nm, 60 nm, 30 nm, 20 nm, 15 nm or 10 nm. The magnetic moment per atom of magnetic nanoparticles of diameter between substantially 1 nm and substantially 5 nm has been found to be significantly higher than for bulk structures formed from the same material. Each magnetic nanoparticle may therefore be of a diameter of no more than substantially 5 nm, 4 nm, 3 nm, 2 nm or 1 nm. Each magnetic nanoparticle may be of a diameter of more than substantially 0.5 nm, 1 nm, 2 nm, 3 nm or 4 nm.

One or more, for example each, nanoparticle may comprise a core and a shell covering at least a portion of the core. Preferably, the shell encompasses the core. The thickness of the shell of the nanoparticles may have any suitable dimensions. Preferably, the thickness of the shell is preferably no more than substantially 4 nm, 2 nm, 1 nm, 0.8 nm, 0.6 nm, 0.4 nm or 0.2 nm.

One or more, for example each, nanoparticle or core of the nanoparticles may be formed from a ferromagnetic material, such as a ferromagnetic element. The ferromagnetic material may be a ferromagnetic transition metal, such as Fe, Co and Ni. The nanoparticles or the core of the nanoparticles may be formed from a diamagnetic transition metal. For hipermag applications it is preferred that each magnetic nanoparticle comprises a core from ferromagnetic transition metal and a shell composed of either a ferromagnetic transition metal layer or a diamagnetic transition metal layer. The diamagnetic transition metal may be a Group 11 metal such as gold or silver. Thus the core/shell composition of the nanoparticles for hipermag applications may be Fe/Co, Co/Fe, Fe/Ag, Co/Ag, Fe/Au or Co/Au.

The nanoparticle-containing coating may be deposited onto the surface(s) of the film portion(s) in the form of a film or layer. The nanoparticles-containing coating may comprise a matrix in which magnetic nanoparticles are embedded. Deposition of the nanoparticle-containing coating, or nanoparticles if deposited separately to a matrix, onto the opposed surfaces of the respective film portion may take place within an electromagnetic field. The use of an electromagnetic field may be advantageous to help to align the nanoparticles on the surface of the respective foil portion in a predetermined orientation.

The nanoparticle-containing coating may be deposited onto the surface(s) of the film portion in a single step process. In one embodiment, the coating may comprise a matrix material and nanoparticles. The matrix material and the nanoparticles may be deposited onto the surface(s) of the film portion simultaneously, for example, by simultaneous operation of a source of matrix material, such as a Molecular Beam Epitaxy (MBE) source, and a source of magnetic nanoparticles, such as a thermal gas aggregation source. A magnetic structure may thereby be formed in which magnetic nanoparticles are distributed through and embedded in the matrix material.

Alternatively, a matrix material may be first deposited onto the surface(s) of the film portion. Magnetic nanoparticles may then subsequently be deposited onto the matrix material as the coating forms to thereby embed the nanoparticles in the matrix material of the coating.

The matrix material may be composed of any suitable material, such as for example ferromagnetic material. Preferably, the matrix material and the nanoparticles, in particular the core of the nanoparticles, are composed of different materials. Covering the nanoparticles at least in part with a layer of matrix material composed of different material composition (for example different metal) to the core reduces the likelihood of cores of nanoparticles coming into contact at particle volume fractions higher than the percolation threshold. Aggregation of magnetic nanoparticles is therefore reduced and an increase in magnetisation is provided.

The matrix material may be of the same material as the nanoparticles, or in some embodiments the shell of the nanoparticles. For example, in one embodiment each magnetic nanoparticle may comprise a Fe core covered at least in part with a layer of Co. The matrix material may be Co. In a further embodiment, the nanoparticle may comprise a Co core covered at least in part with a layer of Fe. The matrix material may be Fe. In a still further embodiment, the nanoparticle may comprise a Co core covered at least in part with a layer of Au. The matrix material may be Au. Using the same material for the shell as for the matrix may be advantageous in hipermag applications. Use of the same material for the shell and matrix material may reduce the likelihood of the particle cores coming into contact even at volume fractions much higher than the percolation threshold.

Preferably, the nanoparticles-containing coating on each surface of the film portion has a thickness of no more than 1 mm, more preferably no more than 0.5 mm, for example about 0.25 mm.

Preferably, the nanoparticles-containing coating applied to each surface of the film portion has a thickness of at least 0.005 mm, preferably of at least 0.025 mm, for example about 0.05 mm.

It is to be understood that the thickness of the nanoparticle-containing coating may vary between each surface of a particular film portion, and/or between surfaces of the film portions within the coated material depending on the requirements for the resultant coated material. Preferably, the thickness of the coating is identical on each surface of each film portion within the coated material.

The volume fraction of coating to film portions within the coated laminate or coated coiled material is preferably at least about 25%, more preferably at least about 30%, especially preferably at least about 40%, for example about 50%.

The volume fraction of coating to film portions within the coated laminate material or coated coiled material is preferably no more than about 75%, more preferably no more than about 70%, especially preferably no more than about 60%.

In accordance with a further aspect of the present invention there is provided a component of an electromagnetic apparatus, in which the component comprises a coated coiled material or coated laminate material formed from a plurality of magnetic nanoparticle-coated steel or iron/cobalt (Fe/Co) alloy film portions, in which the nanoparticles are made of one or more of:
- iron, cobalt, nickel; and/or
- alloys comprising two or more of: iron, cobalt and/or nickel; and/or
- magnetic rare earth metals; and/or
- diamagnetic transition metals.

The nanoparticles may comprise a shell and a core. The shell and core of each respective nanoparticle may be composed of different materials selected from one or more of:
- iron, cobalt, nickel; and/or
- alloys comprising two or more of: iron, cobalt and/or nickel; and/or
- magnetic rare earth metals; and/or
- diamagnetic transition metals.

In accordance with a further aspect of the present invention there is provided a component of an electromagnetic apparatus, in which the component is composed entirely of a coated coiled material or coated laminate material formed from a plurality of nanoparticle-coated steel or iron/cobalt (Fe/Co) alloy film portions, in which nanoparticles are made of one or more of:
- iron, cobalt, nickel; and/or
- alloys comprising two or more of: iron, cobalt and/or nickel; and/or
- magnetic rare earth metals; and/or
- diamagnetic transition metals.

The nanoparticles may comprise a shell and a core. The shell and core of each respective nanoparticle may be composed of different materials selected from one or more of:
- iron, cobalt, nickel; and/or
- alloys comprising two or more of: iron, cobalt and/or nickel; and/or
- magnetic rare earth metals; and/or
- diamagnetic transition metals.

The component of the motor, generator or turbine as described herein may for example be a rotor or a stator.

The orientation of the nanoparticles on the surface of the film portions may be aligned due to deposition within an electromagnetic field.

According to a further aspect of the present invention there is provided apparatus for producing a magnetic nanoparticle-containing coated laminate material or coated coiled material, the apparatus comprising:
- a source of a plurality of steel or iron/cobalt (Fe/Co) alloy portions;
- a source of nanoparticle-containing coating comprising:
  - a source of matrix material which is operable to deposit the matrix material onto at least one surface of a pair of opposed surfaces of the plurality of film portions to thereby form a matrix; and
  - a source of magnetic nanoparticles which is operable to deposit the magnetic nanoparticles onto the matrix as the matrix forms to thereby embed the magnetic nanoparticles in the matrix,
  in which each magnetic nanoparticle are made of one or more of:
  - iron, cobalt, nickel; and/or
  - alloys comprising two or more of: iron, cobalt and/or nickel; and/or
  - magnetic rare earth metals; and/or
  - diamagnetic transition metals.

The nanoparticles may comprise a shell and a core. The shell and core of each respective nanoparticle may be composed of different materials selected from one or more of:
- iron, cobalt, nickel; and/or
- alloys comprising two or more of: iron, cobalt and/or nickel; and/or
- magnetic rare earth metals; and/or
- diamagnetic transition metals.

The source of matrix material may be supplied separately to the source of magnetic nanoparticles. Alternatively, the source of matrix material and the source of magnetic nanoparticles may be supplied as a single nanoparticle-containing source.

The apparatus may further comprise an electromagnetic field operable to provide an electromagnetic field during deposition of the nanoparticle-containing coating, in particular during deposition of the nanoparticles.

The apparatus may further comprise cleaning apparatus operable to remove debris from at least one surface, preferably both surfaces, of a pair of opposed surfaces of the film portions. The cleaning apparatus may be operable to remove debris prior to coating of the surface(s) of the film portions.

Embodiments of the invention will now be described in detail with reference to the accompanying Figures.

DETAILED DESCRIPTION OF THE INVENTION

Embodiments of the invention will now be described, by way of example only.

The apparatus for producing the magnetic nanoparticles-coated materials of the present invention comprises a source of a plurality of film portions. The plurality of film portions according to this embodiment are provided as a single, continuous film. It is however to be understood that the plurality of film portions may be provided as a plurality of discrete film portions.

The film is composed of steel. It is however to be understood that the film may be composed of any other suitable material, such as for example an iron/cobalt alloy.

Figure 1:
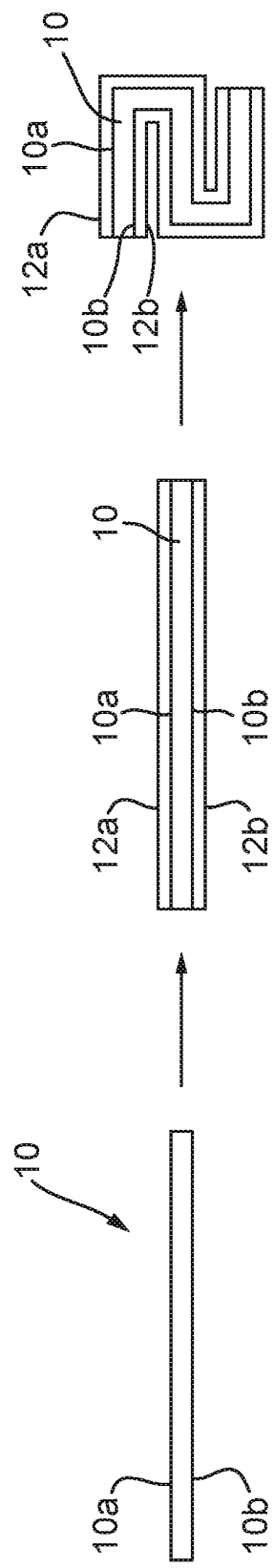
FIG. 1 is a schematic illustration of one embodiment of the present invention for producing a magnetic nanoparticle-containing coated laminate material.
Figure 2:
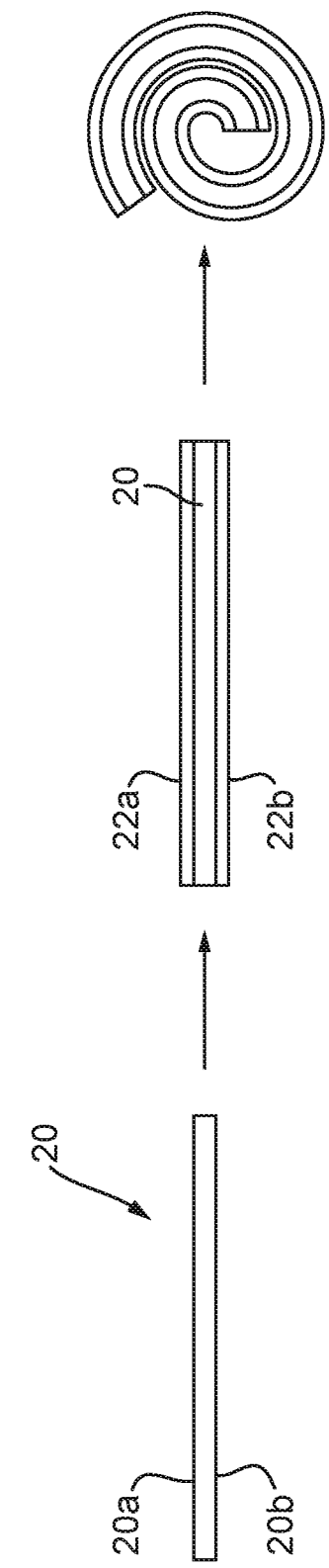
FIG. 2 is a schematic illustration of a further embodiment of the present invention for producing a magnetic nanoparticle-containing coated coiled material.
Figure 3:
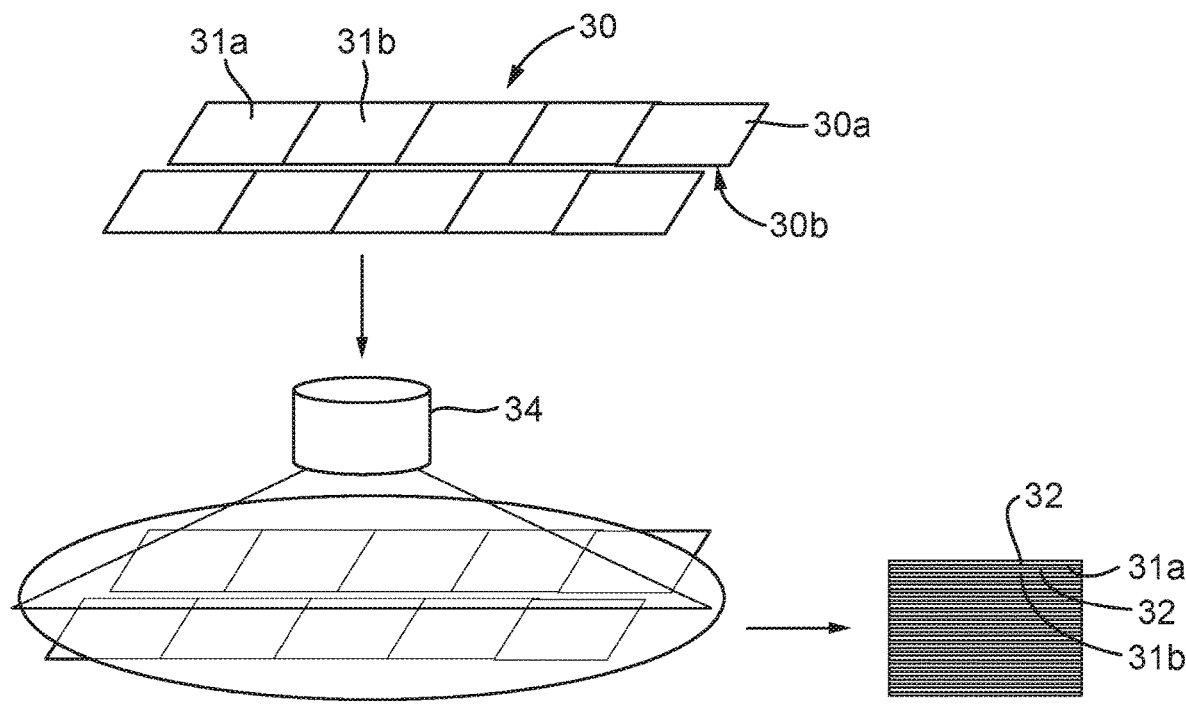
FIG. 3 is a schematic illustration of a further embodiment of the present invention for producing a magnetic nanoparticle-containing coated laminate material.

With reference to FIGS. 1 and 2, the film 10, 20 is elongate in shape. It is however to be understood that the film portions may have any suitable cross-sectional dimensions and shape. For example, as illustrated in FIG. 3, the film 30 may be provided as a plurality of separate film portions, such as for example film tiles 31*a*, 31*b*. Each tile 31*a*, 31*b* provides opposed surfaces for coating having substantially square cross-section.

With reference to FIGS. 1 to 4, the film 10, 20, 30, 40, or each film portion or tile 31*a*, 31*b* provides a pair of opposed surfaces 10*a*, 10*b*, 20*a*, 20*b*, 30*a*, 30*b* to receive a nanoparticle-containing coating 12*a*, 12*b*, 22*a*, 22*b*, 32, 42. The pair of opposed surfaces as shown in FIGS. 1 and 2 are substantially rectangular in shape. It is however to be understood that the surfaces may have any suitable shape depending on the particular requirements for the resultant coated material. As shown in FIG. 3, the surfaces of each film tile 31*a*, 31*b* are substantially square in shape.

The thickness of the film and film portions when measured in a direction extending perpendicular to the plane of the pair of opposed surfaces to be coated is preferably less than the width and length of each of the opposed surfaces.

The film has a thickness of 0.2 mm. It is however to be understood that the film may have any suitable thickness depending on the particular requirements for the resultant coated material. For example, the film has a thickness within the range of between 2 mm and 0.01 mm, preferably between 1 mm and 0.05 mm, more preferably between 0.5 mm and 0.1 mm.

Figure 4:
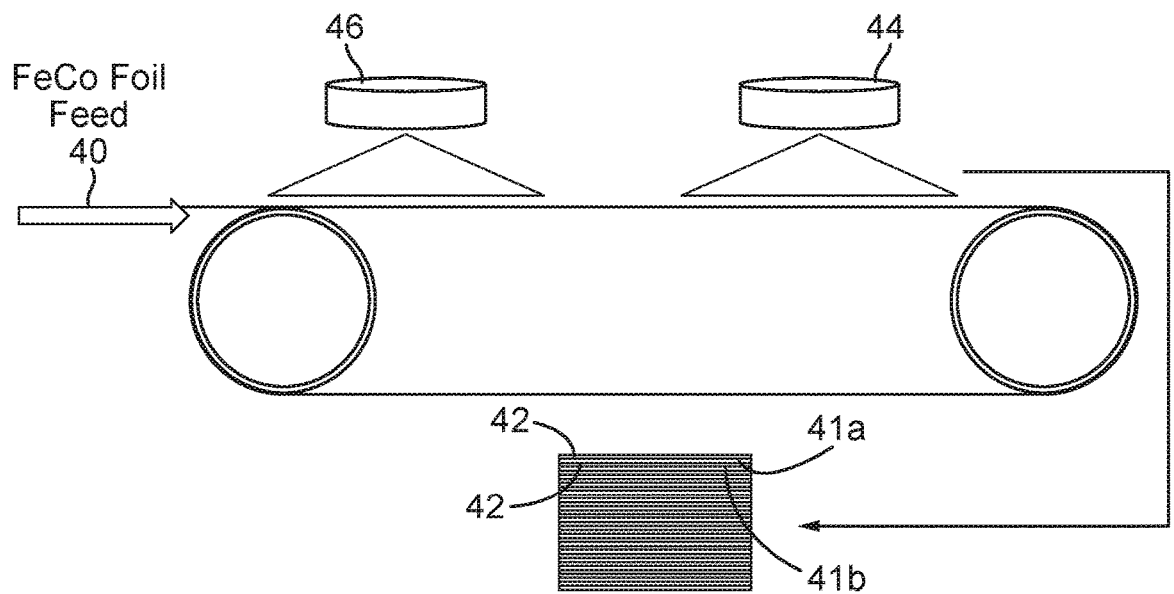
FIG. 4 is a schematic illustration of a further embodiment of the present invention for producing a magnetic nanoparticle-containing coated laminate material.

The apparatus may further comprise a cleaning apparatus, for example a sputter cleaning apparatus 46 as shown in FIG. 4. The cleaning apparatus 46 is preferably operable to remove debris present on the surface, or pair of opposed surfaces, 10*a*, 10*b*, 20*a*, 20*b*, 30*a*, 30*b* of the film 10, 20, 30, 40 prior to coating. It is however to be understood that the surface(s) of the film may in some embodiments be coated without the additional step of cleaning prior to coating.

The apparatus further comprises a source of a nanoparticle-containing coating 34, 44 for deposition on the pair of opposed surfaces 10*a*, 10*b*, 20*a*, 20*b*, 30*a*, 30*b* of the film 10, 20, 30, 40. The source of a nanoparticle-containing coating 34, 44 comprises a source of matrix material and a source of magnetic nanoparticles. The coating comprises a high-moment nanostructured material. The source of matrix material is operable to deposit the matrix material onto the pair of opposed surfaces of the film to form a matrix.

The source of magnetic nanoparticles 34, 44 is operable to deposit the nanoparticles onto the matrix as the matrix forms to embed the nanoparticles in the matrix. The nanoparticles of the coating according to one embodiment each comprise a core and a shell covering at least part of the core. The shell and core are made of different materials selected from one or more of:
- iron, cobalt, nickel; and/or
- alloys comprising two or more of: iron, cobalt and/or nickel; and/or
- magnetic rare earth metals; and/or
- diamagnetic transition metals.

According to one preferred embodiment, the core is composed of iron and the shell is composed of cobalt, or vice versa. Preferably, each nanoparticle comprises an iron core and an iron/cobalt alloy shell, or vice versa.

The source of magnetic nanoparticles 34, 44 and the source of matrix material may deposit the nanoparticles and matrix sequentially or simultaneously onto the surface of the film. It is to be understood that at least one surface of the film portion is coated with the source of magnetic nanoparticles and matrix material, preferably at least a pair of opposed surfaces of the film portions.

There are a number of known processes for depositing nanoparticles on a substrate. According to one embodiment of the present invention, the magnetic nanoparticles are deposited by way of vacuum assisted deposition of magnetic particles in the gas phase and more specifically by way of deposition of a beam of gas-phase magnetic particles. The process comprises causing a beam of magnetic particles to impinge upon the matrix as the matrix forms. The beam may be generated by a gas phase source and more specifically by a cluster beam source, such as a gas aggregation source. The gas phase source may be operative to produce a beam of particle cores absent their layer of metal. A shell may be provided on each core as described herein below. The different forms of gas-phase source generate particles in different size ranges when operated at optimum flux (output) levels. A sputter gas aggregation source normally generates particles having a diameter of about 10 nm when operative at an optimum flux level. A thermal gas aggregation source normally generates smaller particles of about 2 nm diameter when operative at an optimum flux level. The thermal gas aggregation source is often preferred for the formation of high performance magnetic structures (so called hipermags). Deposition of the matrix material may be by way of vacuum assisted deposition of the matrix material in the gas phase and more specifically by way of deposition of an atomic beam of matrix material. The process may thus comprise causing one or more atomic beams of matrix material to impinge upon the opposed surfaces of the plurality of film portions. The atomic beams may be generated by an evaporator, for example, a thermal evaporator such as an MBE source or by sputtering. Forming the magnetic structure by means of an atomic beam of matrix material from an evaporator and a beam of magnetic particles from a cluster source may confer the advantage of providing for independent control over the grain size and volume fraction in the magnetic structure.

The process may further comprise depositing the shell layer on the core of each magnetic nanoparticle. Deposition of the shell layer may be by vacuum assisted deposition of metal vapour. Metal vapour may therefore be provided in a same vacuum as a source of particle cores. The metal vapour may be generated by an evaporator such as a thermal evaporator. The temperature of the thermal evaporator may be determined by the metal of the shell to be deposited, e.g. 800° C. for silver and 1000° C. for iron. A thickness of the shell layer of metal may be controlled by varying the operative temperature of the thermal evaporator in view of it normally being impossible to change the velocity of the particle core beam. The evaporator may be disposed between the source of particle cores and the substrate. In addition the evaporator may be configured to define a space through which a beam of particle cores pass, the evaporator being operative to form a vapour of metal in the space whereby the vapour impinges upon a surface of each particle core. The evaporator may be configured to surround the beam of particle cores. The evaporator may therefore provide for improved coverage of the whole surface of the particle cores. The evaporator may, for example, define a tube through which the beam of particle cores passes. The process may further comprise accelerating a beam of magnetic particles before their deposition onto the matrix. Acceleration may be after deposition of a layer of metal. Acceleration may be achieved by means of apparatus which is configured to interact with the beam of magnetic particles. A venturi may, for example, be used.

Deposition of the stream of free nanoparticles onto the opposed surfaces of the respective film portion may take place within an electromagnetic field. The use of an electromagnetic field may be advantageous to help to align the nanoparticles on the surface of the respective foil portion in a predetermined orientation. By applying an electric field during deposition, the electric field induces a dipole moment in the nanoparticles and hence torque that will rotate them to align with the field. By controlling the electric field it is possible to control the degree of alignment of the nanoparticles. Alternatively, deposition of the nanoparticles may occur within the presence of an electromagnetic field.

The opposed surfaces 10a, 10b, 20a, 20b may be coated with a coating layer or film 12a, 12b, 22a, 22b having any predetermined thickness depending on the requirements for the resultant coated material. According to one embodiment, the coating layer or film 12a, 12b, 22a, 22b has a thickness 0.1 mm. It is however to be understood that the coating layer or film may have any thickness, for example in the range of between 0.005 mm and 1 mm, preferably between 0.025 mm and 0.5 mm, for example between 0.05 mm and 0.25 mm.

According to the embodiment illustrated in FIG. 1, after depositing the coating layer 12a, 12b on to the opposed surfaces 10a, 10b of the continuous film 10, the coated continuous film is folded and portions of the film are stacked on top of each other by folding sections of the coated continuous film on top of adjacent sections of coated film to provide a stack of coated film portions located on top of each other. A portion of each coating layer or film 12a, 12b is located adjacent a further portion of an adjacent coating layer or film 12a, 12b.

According to the embodiment shown in FIGS. 3 and 4, the coated film tiles 31a, 31b, 41a, 41b are stacked on top of each other to provide a stack of coated tiles 31a, 31b, 41a, 41b where each coating layer 32, 42 is located adjacent a further coated layer 32, 42 of an adjacent film tile 31a, 31b, 41a, 41b.

According to a further embodiment, the coated continuous film is cut into a plurality of film portions of predetermined length. The coated film portions are then stacked such that a or each of the coated surfaces of a film portion is located adjacent a coated surface of a further film portion.

The film portions may be stacked to provide a stacked material having any suitable number of foil portion layers depending on the requirements of the resultant laminate material.

The thickness of the film portions and of the coating may be selected depending on the requirements of the resultant laminate material.

The stacking and/or cutting steps may be carried out under any suitable operating conditions. For example, the stacking and/or cutting steps may be carried out at ambient temperature and/or pressure. Alternatively, the stacking and/or cutting steps may be carried out under high temperature and/or pressure. For example, the stacking and/or cutting steps may be carried out under high pressure.

After the coated foil portions have been stacked, the stacked material is subjected to compression to form a nanoparticle-coated laminate material.

The laminate material may comprise any suitable number of foil portion layers. For example, the laminate material preferably comprises about 120 stacked foil portions per inch.

Preferably, the volume fraction of coating to film portions within the resultant laminate material is 50%. It is however to be understood that any suitable volume fractions of coating to film portions may be used. For example, the volume fraction of coating to film portions within the resultant laminate material is between 25% and 75%, preferably between 30% and 70%, for example between 40% and 60%.

The laminate material may be used directly without requiring any further processing steps. Alternatively, the laminate material may be further machined to produce a component of an electromagnetic apparatus, such as for example a component of a motor, generator or turbine, such as for example a rotor or a stator. Machining may occur at ambient temperature and pressure. Alternatively, machining may occur under elevated temperature and/or pressure conditions.

According to a further embodiment of the present invention as illustrated in FIG. 2, after deposition of the nanoparticles coating layer or film 22a, 22b on the opposed surfaces 20a, 20b of the continuous film 20, the coated film is subsequently coiled such that a section of a coated surface of the film is located adjacent a further section of a coated surface of the further film portion within the coiled material.

The coated continuous film may, as discussed above, be cut into a plurality of coated film portions of predetermined length after coating. Alternatively, it is to be understood, as discussed above, that the coating may be applied to opposed surfaces of separate film portions.

The plurality of coated film portions may be coiled together such that a coating on a or each surface of a film portion is located adjacent a further coating on a surface of a further film portion within the coiled material.

The coiled material may comprise any suitable number of coiled foil portion layers. For example, the coiled material preferably comprises about 120 stacked foil portions per inch.

Preferably, the volume fraction of coating to film portions within the resultant coiled material is 50%. It is however to be understood that any suitable volume fractions of coating to film portions may be used. For example, the volume fraction of coating to film portions within the resultant laminate coiled is between 25% and 75%, preferably between 30% and 70%, for example between 40% and 60%.

The coated coiled material may be used directly without any further processing.

Alternatively, the coated coiled material may be machined to provide a component of an electromagnetic apparatus have predetermined shape and dimensions, such as for example a component of a motor, generator or turbine, such as for example a rotor or a stator. Machining may occur at ambient temperature and pressure. Alternatively, machining may occur under elevated temperature and/or pressure conditions.

The present invention may be used specifically to provide coated laminate or coiled material for use in components of electromagnetic apparatus, such as for example motors, generators or turbines. The coated laminate or coiled materials of the present invention have been found to have improved magnetic moments compared to conventional components used in electromagnetic apparatus. As a result of the increased magnetic moments, components of the apparatus can be made from the coated laminate or coiled materials of the present invention while advantageously reducing the weight and dimensions of the components. The components of the apparatus, and potentially the electromagnetic apparatus itself, can therefore be made on a smaller scale whilst having the same energy output as conventional components made from conventional materials. The coated laminate and coiled materials of the present invention therefore save on the energy required to produce components for electromagnetic apparatus. The energy and costs required to manufacture the components of the electromagnetic apparatus is far less when using the coated laminate and coiled materials of the present invention.

Example 1—Deposition of Metal Nanoparticles on Film Portions

A continuous film of an iron/cobalt alloy having a thickness of 2 nm was used. Sputter deposition was used to generate metal nanoparticles. The sputtering process according to this example was performed using $SF_6$ gas at a flow rate of 20 SCCM (SCCM used herein to denote cubic centimetre per minute at STP) at a pressure of 0.130 Torr. A 50 W rf power at 13.56 MHz was used to ionise the gas for various sputtering times. The generated F– ions then hit the metal source, in this case Co metal source, to create atoms vapour which subsequently or simultaneously deposit Co nanoparticles with diameters in the range of 1 nm to 5 nm on one or each surface of the film portion.

It is to be understood that the sputter deposition may be carried out using other suitable gas source at appropriate flow rates and pressures for deposition to occur on the film portion. It is also to be understood that sputter deposition can be used with any suitable metal and/or alloy to form the desired metal nanoparticles.

The resultant coated film has a coating layer with a thickness of 0.25 mm.

Although the present invention is described in relation to components of electromagnetic apparatus It is to be understood that the present invention may be used to provide coated laminate or coiled material for use in any technological area where it is found to have an efficacious effect.

Although aspects of the invention have been described with reference to specific embodiments, it is to be understood that the invention is not limited to the precise embodiments and that various changes and modifications may be effected without further inventive skill and effort.

The invention claimed is:

1. A method for producing a magnetic nanoparticle-coated laminate material comprising:
  coating at least one surface of a pair of opposed surfaces of a plurality of steel or iron/cobalt (Fe/Co) alloy film portions with a matrix material to thereby form a matrix and subsequently depositing magnetic nanoparticles onto the matrix as the matrix forms, to thereby embed the magnetic nanoparticles in the matrix, in which each magnetic nanoparticle is selected from one or more of:
    iron, cobalt, nickel; and/or
    alloys comprising two or more of: iron, cobalt and/or nickel; and/or magnetic rare earth metals; and/or diamagnetic transition metals;
  stacking the coated film portions on top of each other such that each at least one coated surface of each film portion is located between adjacent film portions; and
  compressing the stacked coated film portions together to form a nanoparticle-coated laminate material.

2. A method as claimed in claim 1, in which the film portions are provided by a continuous film, and in which the method further comprises cutting the coated continuous film into separate coated film portions of predetermined dimensions prior to stacking.

3. A method as claimed claim 1, in which the coated laminate material is further machined to form a nanoparticle-containing coated component of an electromagnetic apparatus.

4. A method as claimed in claim 1, in which one or more of the stacking, and/or compressing and/or machining steps is carried out at ambient temperature.

5. A method as claimed in claim 1, in which one or more of the coiling or stacking, and/or compressing and/or machining steps is carried out under vacuum.

6. A method as claimed claim 1, in which the film portions have a thickness of no more than 2 mm.

7. A method as claimed in claim 1, in which the film portions have a thickness of at least 0.01 mm.

8. A method as claimed in claim 1, in which the film portions have a thickness of about 0.2 mm.

9. A method as claimed in claim 1, in which the nanoparticles-containing coating on each surface has a thickness of no more than 1 mm.

10. A method as claimed claim 1, in which the nanoparticles-containing coating on each surface has a thickness of at least 0.005 mm.

11. A method as claimed in claim 1, in which the volume fraction of coating to film portions within the coated laminate material is about 50%.

12. A method as claimed in claim 1, in which each surface of a pair of opposed surfaces of a plurality of steel or iron/cobalt (Fe/Co) alloy film portions is coated with a magnetic nanoparticle-containing coating.

13. A method as claimed in claim 1, in which the nanoparticles each comprise a shell and core, and in which the shell and core of each nanoparticle are made of different materials selected from one or more of:
  iron, cobalt, nickel; and/or
  alloys comprising two or more of: iron, cobalt and/or nickel; and/or magnetic rare earth metals; and/or
  diamagnetic transition metals.

14. A method for producing a magnetic nanoparticle-coated laminate material comprising:
  coating at least one surface of a pair of opposed surfaces of a plurality of steel or iron/cobalt (Fe/Co) alloy film portions with a magnetic nanoparticle-containing coating in which the coating is deposited in the presence of an electromagnetic field, and in which each magnetic nanoparticle is selected from one or more of:
    iron, cobalt, nickel; and/or
    alloys comprising two or more of: iron, cobalt and/or nickel; and/or magnetic rare earth metals; and/or
    diamagnetic transition metals;
  stacking the coated film portions on top of each other such that each at least one coated surface of each film portion is located between adjacent film portions; and
  compressing the stacked coated film portions together to form a nanoparticle-coated laminate material.

15. A method for producing a magnetic nanoparticle-coated coiled material comprising:
  coating at least one surface of a pair of opposed surfaces of a plurality of steel or iron/cobalt (Fe/Co) alloy film portions with a matrix material to thereby form a matrix, and subsequently depositing magnetic nanoparticles onto the matrix as the matrix forms, to thereby embed the magnetic nanoparticles in the matrix, in which each magnetic nanoparticle is selected from one or more of:
    iron, cobalt, nickel; and/or
    alloys comprising two or more of: iron, cobalt and/or nickel; and/or magnetic rare earth metals; and/or
    diamagnetic transition metals
  coiling the coated film portions such that each at least one coated surface of each film portion is located between adjacent film portions; and
  compressing the coiled coated film portions together to form a nanoparticle-coated coiled material.

16. A method as claimed in claim 15, in which the film portions are provided by a continuous film, and in which the method further comprises cutting the coated continuous film into separate coated film portions of predetermined dimensions prior to coiling.

17. A method as claimed claim 15, in which the coated coiled material is further machined to form a nanoparticle-containing coated component of an electromagnetic apparatus.

18. A method as claimed in claim 15, in which one or more of the coiling, and/or compressing and/or machining steps is carried out at ambient temperature.

19. A method as claimed in claim 15, in which the volume fraction of coating to film portions within the coated coiled material is about 50%.

* * * * *

UNITED STATES PATENT AND TRADEMARK OFFICE
CERTIFICATE OF CORRECTION

PATENT NO. : 11,384,422 B2
APPLICATION NO. : 16/465143
DATED : July 12, 2022
INVENTOR(S) : Patrick William John Kinmont, Robert Davidson Binns and Christopher Robin Binns Page 1 of 1

It is certified that error appears in the above-identified patent and that said Letters Patent is hereby corrected as shown below:

In the Claims
In Claim 3, after "claimed" insert --in--.
In Claim 6, after "claimed" insert --in--.
In Claim 10, after "claimed" insert --in--.
In Claim 17, after "claimed" insert --in--.

Signed and Sealed this
Twenty-seventh Day of December, 2022

Katherine Kelly Vidal
*Director of the United States Patent and Trademark Office*